United States Patent [19]
Yokozawa

[11] Patent Number: 5,663,087
[45] Date of Patent: Sep. 2, 1997

[54] METHOD FOR FORMING SILICON NITRIDE FILM HAVING LOW LEAKAGE CURRENT AND HIGH BREAK DOWN VOLTAGE

[75] Inventor: Ayumi Yokozawa, Tokyo, Japan

[73] Assignee: NEC Corporation, Japan

[21] Appl. No.: 310,279

[22] Filed: Sep. 21, 1994

[30] Foreign Application Priority Data

Sep. 21, 1993 [JP] Japan .................................. 5-234861

[51] Int. Cl.$^6$ .................................................. H01L 21/318
[52] U.S. Cl. .................................................. 438/762; 438/791
[58] Field of Search .................................. 437/241, 242, 437/60, 919, 978; 148/DIG. 43

[56] References Cited

PUBLICATIONS

"The Effect of Surface Roughness of $Si_3N_4$ Films on TDDB Characteristics of ONO Films", Tanaka et al, IEEE, 1992, pp. 31–36.

"Ultrathin Silicon Nitride Films Prepared by Combining Rapid Thermal Nitridation with Low–Pressure Chemical Vapor Deposition", Ando et al, Appl. Phys. Lett., vol. 59, No. 9, Aug. 26, 1991, pp. 1081–1083.

*Primary Examiner*—George Fourson
*Attorney, Agent, or Firm*—Ostrolenk, Faber, Gerb & Soffen, LLP

[57] ABSTRACT

The present invention provides a method for forming a silicon nitride film used for a capacitor dielectric film on a silicon substrate and a poly-silicon layer which comprises steps of forming a first thin silicon nitride film by a rapid thermal nitrogen process and forming a second silicon nitride film on the first thin silicon nitride film to a required thickness by LPCVD. In the LPCVD, a gas which reduces surface reactions is introduced to a growing surface of the silicon nitride film by a means different from a means supplying starting material gases of the silicon nitride film, so as to improve a break down voltage and leakage current of the capacitor silicon nitride film.

1 Claim, 8 Drawing Sheets

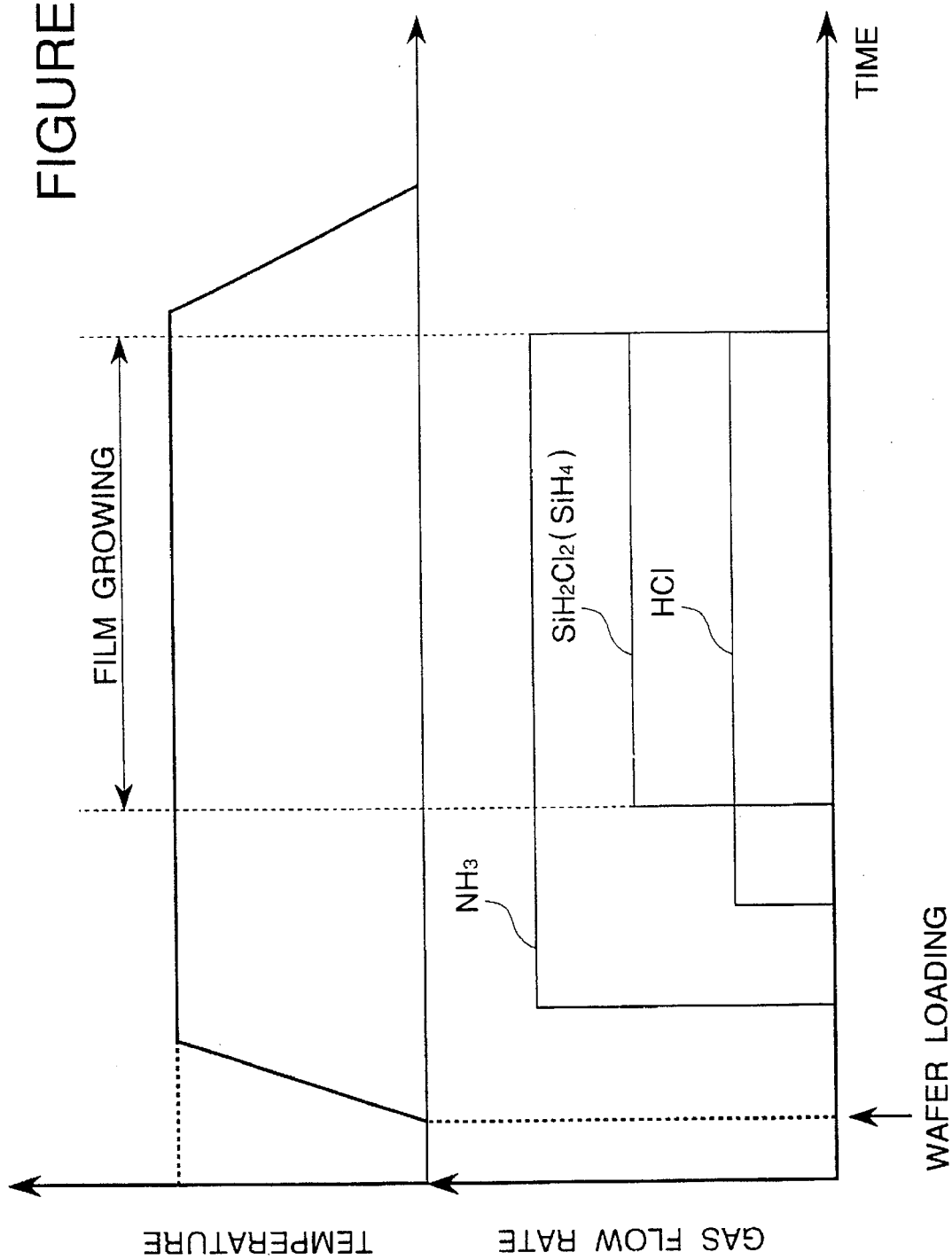

- 303 UPPER ELECTRODE
- 306 TRENCH
- 302 CAPACITOR DIELECTRIC FILM
- 301 SILICON SUBSTRATE

- 302 CAPACITOR DIELECTRIC FILM
- 303 UPPER ELECTRODE
- 304 FIELD OXIDE FILM
- 301 SILICON SUBSTRATE
- 305 LOWER ELECTRODE

METHOD FOR FORMING SILICON NITRIDE FILM HAVING LOW LEAKAGE CURRENT AND HIGH BREAK DOWN VOLTAGE

BACKGROUND OF THE INVENTION

1. Field of the Invention

The present invention relates to a method for forming a silicon nitride film having low leakage current and a high break down voltage, more specifically to a method for forming a ultra thin silicon nitride capacitor film having low-leakage current characteristics and a high break down voltage.

2. Description of Related Art

Recently, semiconductor devices have been highly integrated and have become finer, so that capacitor dielectric films of dynamic-random access memories (DRAMs) have become thinner. For example, silicon nitride films which have come in practical use as the capacitor dielectric films have thickness of equal to or less than 10 nanometers.

The silicon nitride capacitor film has been formed by low pressure chemical vapor deposition (LPCVD) using a mixture of a gas of the silane family, for example, dichlorosilane ($SiH_2Cl_2$) gas and ammonia ($NH_3$) vapor, in which mixture rate of $SiH_2Cl_2$: $NH_3$ is 1:5 to 1: 10, at a temperature of 680° to 800° C. (H. Tanaka et al., IEEE/IRPS 31 (1992)). In this process, due to a native oxide layer on a surface of a silicon substrate or a lower electrode of poly-silicon and air ingress into a LPCVD apparatus during loading of silicon wafers in the LPCVD apparatus, oxygen enters into the silicon nitride film so that defects at which stoichiometric composition (Si: N=3: 4; $Si_3N_4$) is broken are created.

The defects, which are caused by broken or distorted bonds between atoms and so called "weak spots" are liable to be starting points of dielectric break down, which degrades a dielectric strength of the silicon nitride film. In addition, portions at which the bonds between atoms are broken are prone to be oxidized which induces further ingress of oxygen into the silicon nitride film so that the silicon nitride film is degraded and its dielectric constant is decreased.

In a prior art, in order to improve reliability of the silicon nitride film, there is provided a process including steps of removing a native oxide layer and immediately forming a thin silicon nitride film having a stoichiometric composition on a capacitor electrode by rapid thermal nitridation (RTN) in ammonia vapor prior to LPCVD so as to prevent growth of uncontrollable oxide layer which are undesirably on the capacitor electrode formed by only LPCVD (K. Ando et al., Appl. Phys. Lett. vol. 59, No. 9 pp. 1081–1083 (1991)).

Referring to FIGS. 1A to 1E, the above conventional process for forming a silicon nitride film will be described. FIGS. 1A to 1E are schematic sectional views illustrating the above conventional process.

As shown in FIG. 1A, field oxide layers 102 having a thickness of several thousands angstroms are formed on a silicon substrate 101 under oxygen atmosphere so as to separate a device region. Then, a poly-silicon film 103 having a thickness of 1000–2000 angstroms is formed as a lower electrode of a stacking capacitor on the silicon substrate 101 by CVD, as shown in FIG. 1B.

Thereafter, a native oxide film on the poly-silicon film 103 is removed so as to expose a surface of the poly-silicon film 103 by a processing using weak hydrofluoric acid etc. Immediately, the surface of the poly-silicon film 103 is nitrized by a rapid thermal process having a duration of 60 seconds in ammonia vapor under atmospheric pressure at a temperature of 800° to 1000° C. (RTN) so as to form a thin silicon nitride film 104 having a thickness of 10 to 20 angstroms, as shown in FIG. 1C.

Then, a nitride film 105 having a thickness of 50 to 100 angstroms is formed on the thin silicon nitride film 104 by LPCVD with a mixture of a gas of the silane family such as monosilane gas or dichlorosilane gas and ammonia at a temperature of 700° to 800° C., as shown in FIG. 1D. A poly-silicon film 106 is formed as an upper electrode on the capacitor silicon nitride film 105 by CVD so that a capacitor of DRAM is completed, as shown FIG. 1D.

In the conventional LPCVD, the silicon nitride film is deposited by using only one of silane gases and ammonia vapor, so that Si-N bonds are formed by reactions of species of silylenes such as $SiCl_2$ and $SiH_2$ with ammonia. However, it is known that the species of silylenes are also easy to form Si—Si bonds. Therefore, in the above mentioned process, though a stoichiometric thin silicon nitride film exists only on the poly-silicon film of the lower capacitor electrode, which is formed by the RTN process, the capacitor silicon nitride film includes many Si—Si bonds since the most of the silicon nitride film is formed by the conventional LPCVD. The Si—Si bonds in the silicon nitride film are conductive so that the leakage current increases as the Si—Si bonds increase. In addition, the structure of the silicon nitride film is considered to be distorted near the portions of the Si—Si bonds, which becomes the weak spots. Therefore, dielectric break down is prone to occur by increase in the Si—Si bonds.

In order to prevent the Si—Si bonds formation and to form a stoichiometric silicon nitride film, the flow rate of the ammonia gas is increased relatively to the silane gas in the conventional LPCVD process. However, by the above conventional process, it is impossible to selectively suppress the formation of the Si—Si bonds so that the problem of the formation of the Si—Si bonds can not be fundamentally resolved. Consequently, it is difficult to form a bulk stoichiometric silicon nitride film using the RTN+LPCVD process as shown in FIGS. 1A to 1E.

In another prior art, there is provided a process in which an reliable oxide film is formed on a silicon wafer by CVD using a mixture of gases including hydrogen chloride (HCl), as shown Japanese Patent Application Laid-open No. 156637/1990. In this process, silicon wafers are loaded into a reactive furnace of, for example, a quartz pipe and the reactive furnace is evacuated to a pressure of on the order of 1.0 Torr. Thereafter, nitrogen ($N_2$) is introduced into the reactive furnace so as to replace inner atmosphere with nitrogen atmosphere. Then, the inside of the reactive furnace is heated to a temperature of 600° to 900° C. Mixture gas including silane ($SiH_4$) or disilane ($Si_2H_6$) having a flow rate of 30 $cm^3$/minute, dinitrogen monoxide ($N_2O$) having a flow rate of 1.5 $cm^3$/minute and hydrogen chloride having a flow rate of 1 to 1000 $cm^3$/minute is introduced so that oxide films are grown on the silicon wafers. In this process, the hydrogen chloride getters impurity metals at temperatures of higher than 400° C., so that impurity metals in the oxide films are removed so as to prevent initial shortage of break down voltage and to reduce leakage current.

If the above process is applied to the formation of the silicon nitride film using ammonia instead of dinitrogen monoxide, thermal decomposition of dichlorosilane is suppressed since hydrogen chloride is formed by the decomposition. Therefore, formation of reactive species ($SiCl_2$, SiHCl) which are also formed by the decomposition and contribute the deposition of the silicon nitride film are prevented, so that a higher process temperature is necessary to obtain a practical deposition rate. However, the higher process temperature promotes the formation of the Si—Si bonds so that a composition of the silicon nitride film greatly deviates from the stoichiometric composition.

In addition, hydrogen chloride is prone to join with ammonia so as to form ammonium chloride ($NH_4Cl$) in a vapor phase, which contributes particles and which prevents hydrogen chloride from being absorbed on a surface of the depositing silicon nitride film. Therefore, in order to improve the stoichiometry of the silicon nitride film by absorbing hydrogen chloride on the surface of the silicon nitride film, it is considered to be insufficient to add hydrogen chloride to the growing gas in the LPCVD process.

SUMMARY OF THE INVENTION

Accordingly, it is an object of the present invention to provide a method for forming a silicon nitride film having low leakage current and a high break down voltage, which have overcome the above mentioned defects of the conventional ones.

Another object of the present invention is to provide an apparatus used for conducting the above method.

The above and other objects of the present invention are achieved in accordance with the present invention by a method for preparing a semiconductor device by forming a silicon nitride film on a silicon substrate and a poly-silicon layer by LPCVD comprising conducting the LPCVD by supplying starting material gases of the silicon nitride film with introducing a specified gas to a growing surface of the silicon nitride film.

According to the another aspect of the present invention, there is provided a method for forming a silicon nitride film on a silicon substrate and a poly-silicon layer comprising steps of forming a first thin silicon nitride film by a rapid thermal nitrogen process and forming a second silicon nitride film on the first thin silicon nitride film to a required thickness by LPCVD in which a gas which reduces surface reactions is introduced to a growing surface of the silicon nitride film by a means different from a means supplying starting material gases of the silicon nitride film.

In a preferred embodiment of the present invention, the gas which reduces surface reactions is hydrogen chloride.

In a preferred embodiment, the starting material gases include dichlorosilane ($SiH_2Cl_2$) and ammonia ($NH_3$) or includes monosilane ($SiH_4$) and ammonia ($NH_3$).

According to still another aspect of the present invention, there is provided an apparatus for conducting LPCVD comprising a vacuum chamber provided with an inlet and an outlet, and a substrate holder provided at a bottom of the vacuum chamber for holding a substrate on which a film is to be deposited, a heater enclosing the vacuum chamber so as to heat the inside of the vacuum chamber, a intake pipe having a nozzle at its tip so as to introduce a gas in proximity of the substrate held by the sample holder in which a distance between the substrate and the nozzle, a height and an angle of the nozzle to the substrate can be changed.

The above and other objects, features and advantages of the present invention will be apparent from the following description of preferred embodiments of the invention with reference to the accompanying drawings.

BRIEF DESCRIPTION OF THE DRAWINGS

FIG. 4 is a graph showing gas supply in the embodiment of the process in accordance with the present invention;

DESCRIPTION OF THE PREFERRED EMBODIMENTS

Figure 1A:
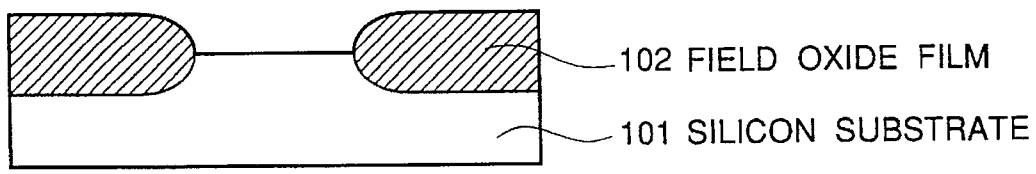
FIGS. 1A to 1E are schematic sectional views illustrating conventional process for forming a stacked capacitor in which a silicon nitride film is used as a capacitor dielectric film.

There is shown a diagrammatic sectional view of an LPCVD apparatus which can be used for conducting the process in accordance with the present invention.

The shown LPCVD apparatus comprises a vacuum chamber 201 provided with an inlet 206 and an outlet 207, and a substrate holder 205 provided at a bottom of the vacuum chamber 201 for holding a silicon wafer 203 on which a silicon nitride film 204 is to be deposited. The vacuum chamber 201 is enclosed by a heater 202 so as to heat the inside of the vacuum chamber 201. In addition, the vacuum chamber 201 is also provided with intake pipes 208 having nozzles 209 at their tips so as to introduce hydrogen chloride in proximity of the silicon wafer 203 held by the sample holder 205. The distances r between the center of the silicon wafer 203 and the nozzles 209, heights h and the angles θ of the nozzles 209 to the silicon wafer 203 can be changed. In this embodiment, the distances r can range 0 to a diameter of the silicon wafer 203, the heights can range h 0 to 25 centimeters (which is almost equal to five times of the mean free path of the inside of the vacuum chamber 201 during the film deposition process), and the angles θ can ranges 0° to 60°. The vacuum chamber 201 can be provided with only one intake pipe 208 having nozzle 209. The angles θ are determined by a size of the silicon wafer 203 and the presence or absence of irregularities such as trenches of the surface of the silicon wafer 203. However, small angles equal to or less than 20° are preferable in order that hydrogen chloride flows parallel to a surface of the silicon wafer so that hydrogen chloride is absorbed by the whole surface of the silicon wafer.

Figure 3A:
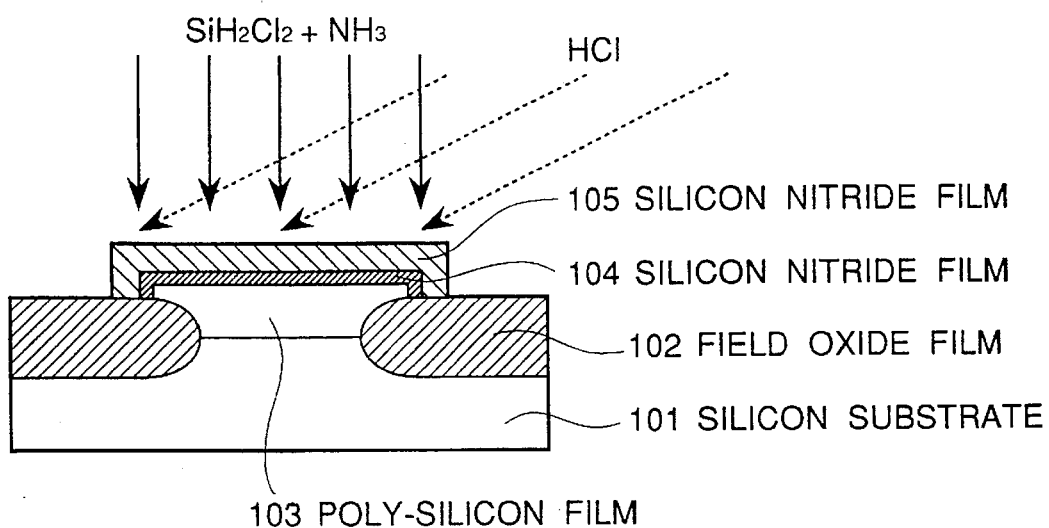
FIGS. 3A and 3B are schematic sectional views illustrating featured steps of an embodiment of the process in accordance with the present invention.
Figure 3B:
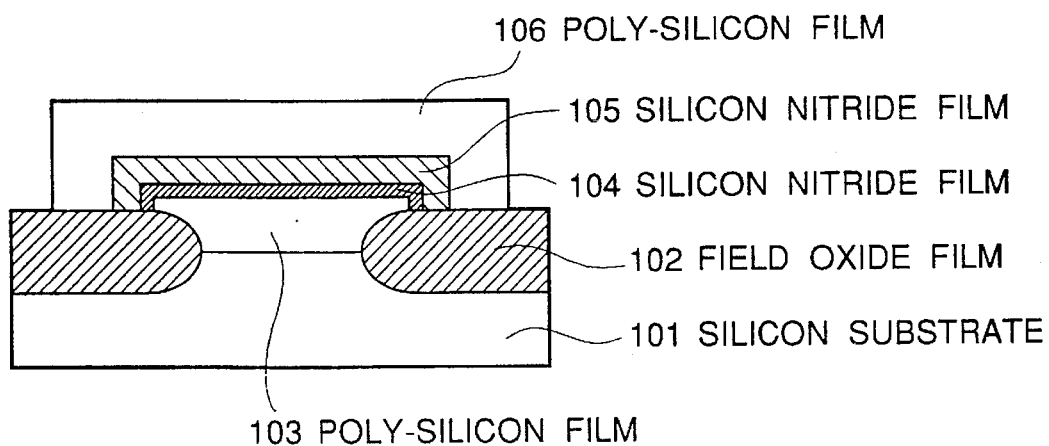

Referring to FIGS. 3A and 3B, an embodiment of the process for forming a stacked capacitor in which a silicon nitride film is used as a capacitor dielectric film will be described.

Figure 1B:
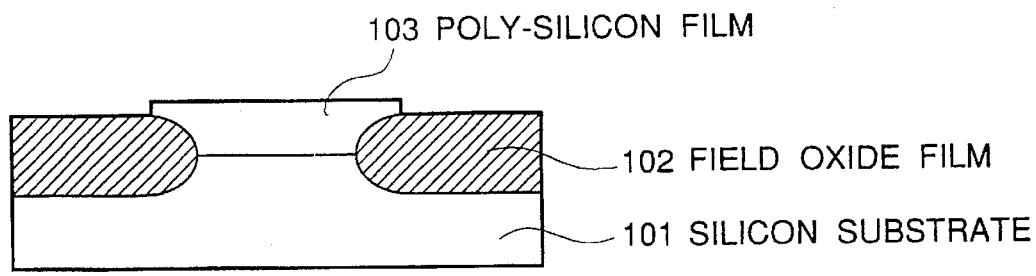
Figure 1C:
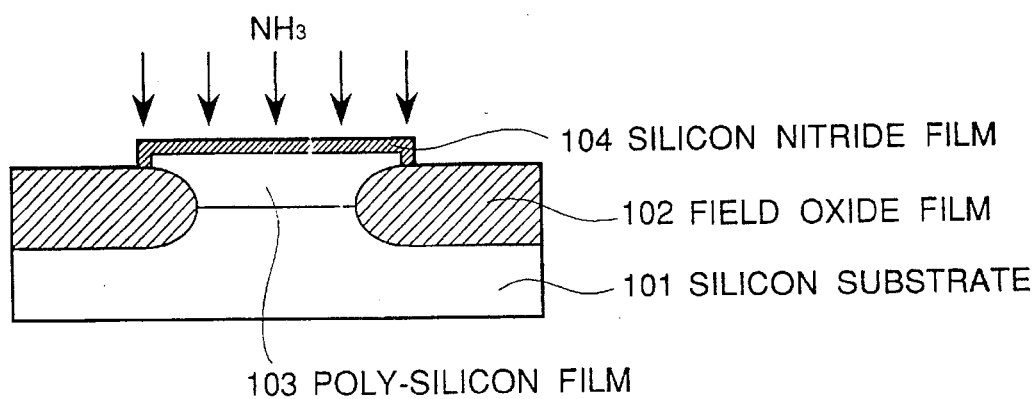
Figure 1D:
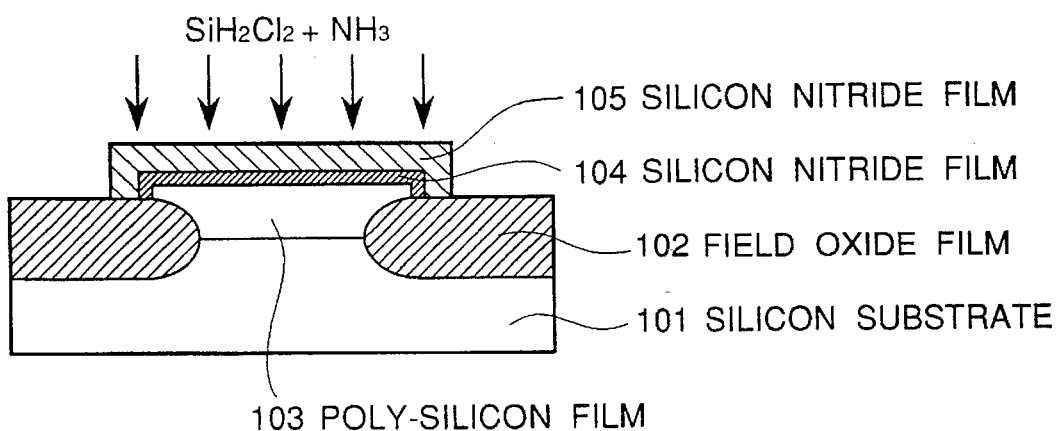
Figure 1E:
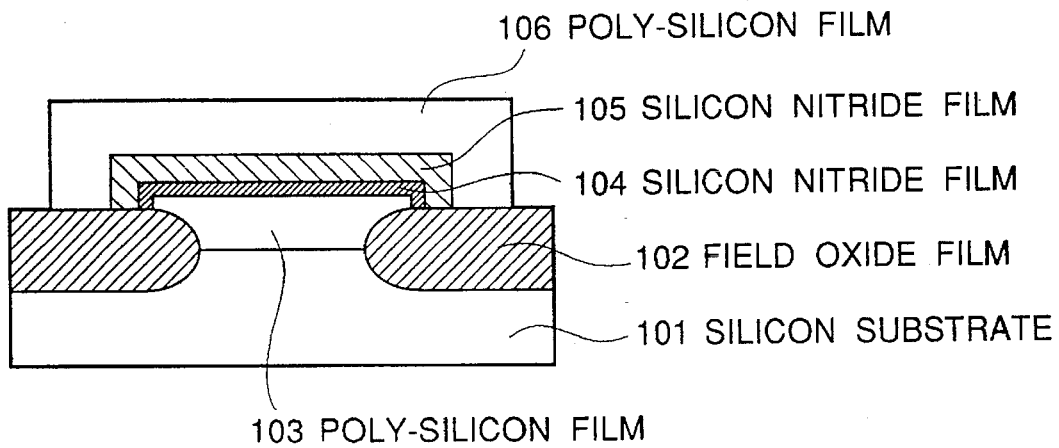
Figure 2:
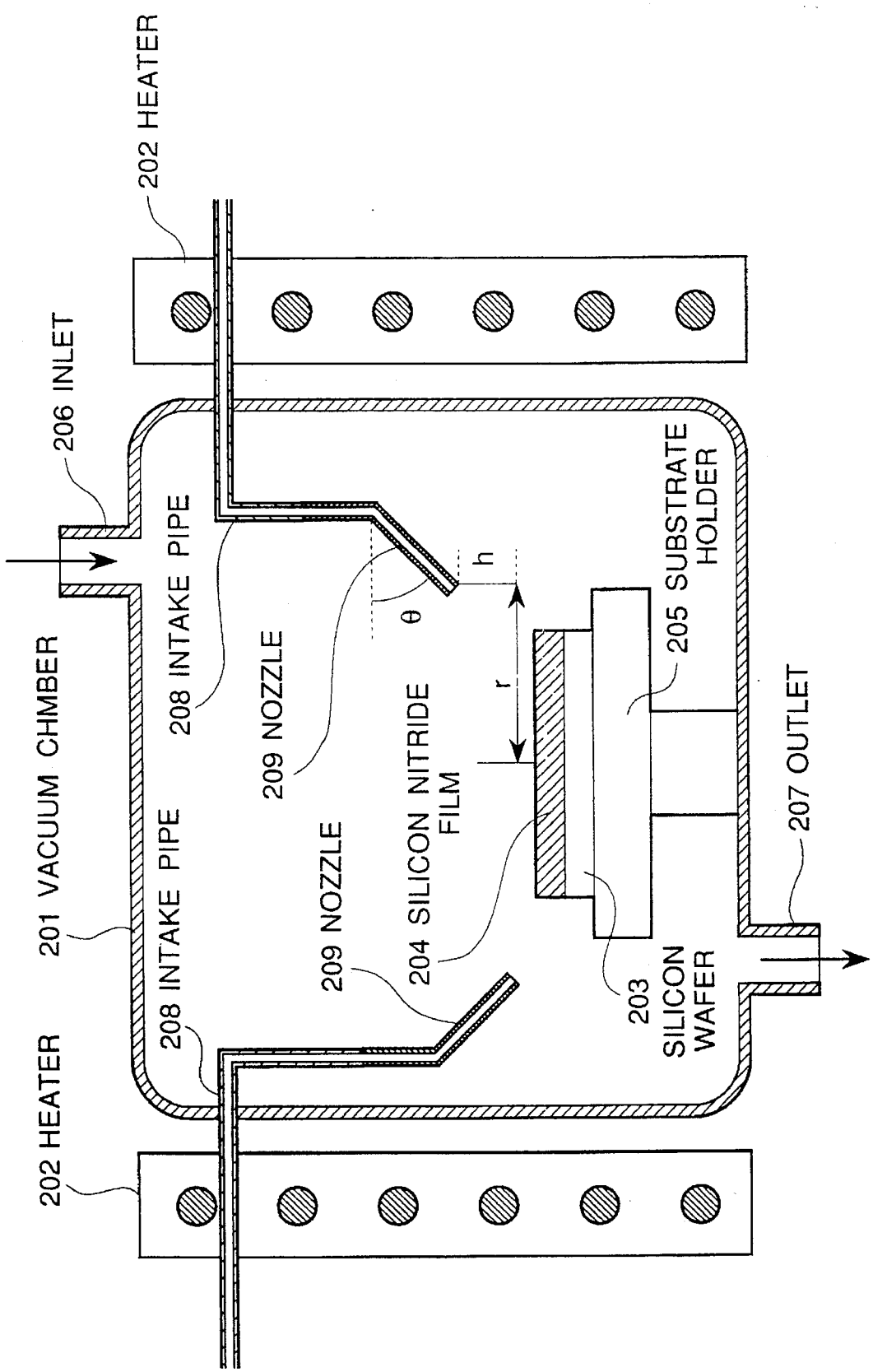
FIG. 2 is a schematic sectional view of an LPCVD apparatus for conducting the process in accordance with the present invention.

In this embodiment, the same processings as those shown in FIGS. 1A to 1C are performed. After the thin silicon nitride film 104 having a thickness of 10 to 15 angstrom is formed by RTN, the silicon wafer of silicon substrate 101 is loaded into the LPCVD apparatus shown in FIG. 2.

Then, the vacuum chamber 201 is closed and evacuated to vacuum from the outlet 207. Simultaneously, the inside of the vacuum chamber 201 including the silicon wafer is heated by the heater 202. After heating to a required temperature, ammonia vapor is introduced into the vacuum chamber 201 from the inlet 206.

Thereafter, hydrogen chloride is introduced in proximity of the silicon wafer from the nozzles 209. Finally, a silane gas is introduced into the vacuum chamber 201 from the inlet 206 so as to begin deposition of a silicon nitride film 204 on the silicon wafer 203. The timings of the gas supply is shown in FIG. 4.

The preferable conditions for deposition of the silicon nitride film are shown as follows:

| Growing gas | $SiH_2Cl_2 + NH_3$ | $SiH_4 + NH_3$ |
|---|---|---|
| Mixture rate | $SiH_2Cl_2/NH_3 = 0.25 - 0.5$ | $SiH_4/NH_3 = 0.05 - 0.1$ |
| Total pressure | 0.05–2 Torr | 0.1–2 Torr |
| Total gas flow rate | 100–1000 sccm | 100–1000 sccm |
| Temperature | 600–700° C. | 600–750° C. |
| HCl content | 3–10% of total gas | 10–15% of total gas |

Typical conditions of the for deposition of the silicon nitride film are shown as follows:

| Growing gas | $SiH_2Cl_2 + NH_3$ |
|---|---|
| Mixture rate | $SiH_2Cl_2/NH_3 = 0.2$ |
| Total pressure | 0.4 Torr |
| Total gas flow rate | 400 sccm |
| Temperature | 650° C. |
| HCl content | 5–7% of total gas |

The higher the process temperature, the more hydrogen chloride should be supplied.

After the silicon nitride film 105 is deposited to a required thickness of 50 to 80 angstrom, a poly-silicon film 106 of an upper electrode is deposited on the silicon nitride film 105 so that a stacked capacitor is completed, as shown in FIG. 3B.

In the above process, positions and angles of the nozzles 209 are determined by a structure of the lower electrode of the capacitor. By this, absorption positions of hydrogen chloride are controlled. The absorption of hydrogen chloride suppresses reactions of a growing surface of the silicon film, which improves step coverage.

The absorption portion of the hydrogen chloride can be controlled by changing positions and angles of the nozzles. By this, a local surface reaction coefficient can be changed in addition to reducing a reaction coefficient of the whole surface of the silicon wafer. Therefore, according to the present invention, it is possible to improve step coverage of the deposition of silicon nitride film by LPCVD utilizing monosilane gas and ammonia vapor by changing a local surface reaction coefficient in addition to reducing a reaction coefficient of the whole surface of the silicon wafer.

Hydrogen chloride introduced to the surface of the silicon wafer contributes absorption of hydrogen chloride on the growing surface of the silicon nitride film. Since hydrogen chloride tends to be absorbed on a "silicon surface portion" at which Si is the topmost atom more than on a "nitrogen surface portion" at which N is the topmost atom, the absorption of hydrogen chloride selectively prevents the silicon surface portion from reacting with $SiCl_2$ and $SiH_2$ so that formation of Si—Si bonds is suppressed in the deposition of the silicon nitride film so as to improve its break down voltage and to reduce leakage current.

Figure 6:
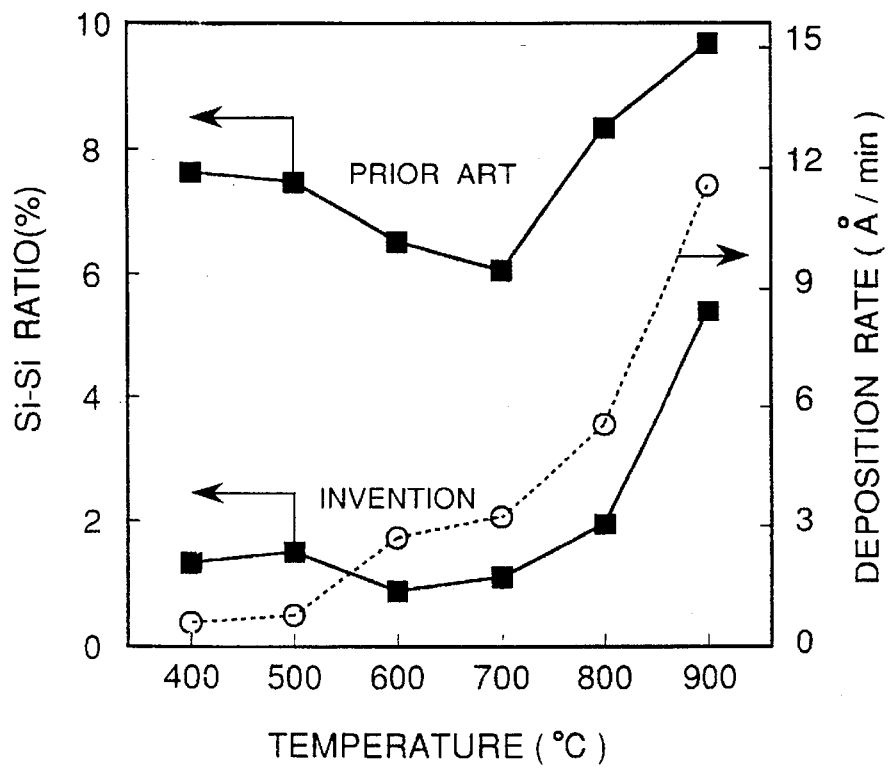
FIG. 6 is a graph showing compositions of silicon nitride films formed by the process in accordance with the present invention and by a conventional process.

FIG. 6 is a graph showing Si—Si bonds in silicon nitride films formed in accordance with the present invention and formed by a conventional process. The conditions of the process in accordance with the present invention are as follows:

| Growing gas | $SiH_2Cl_2 + NH_3$ |
|---|---|
| Mixture rate | $SiH_2Cl_2/NH_3 = 0.2$ |
| Total pressure | 0.4 Torr |
| Total gas flow rate | 400 sccm |
| HCl content | 7% of total gas |

As shown in FIG. 6, the Si—Si bonds in silicon nitride films formed in accordance with the present invention are reduced to a quarter of those of the conventional process. By this, it is ascertained that a capacitor silicon nitride film having a stoichiometric composition can be formed in accordance with the present invention.

In addition, a silicon nitride film formed by using monosilane and ammonia according to the present invention has a break down voltage and leakage current similar to those of one formed by dichlorosilane and ammonia.

Figure 7:
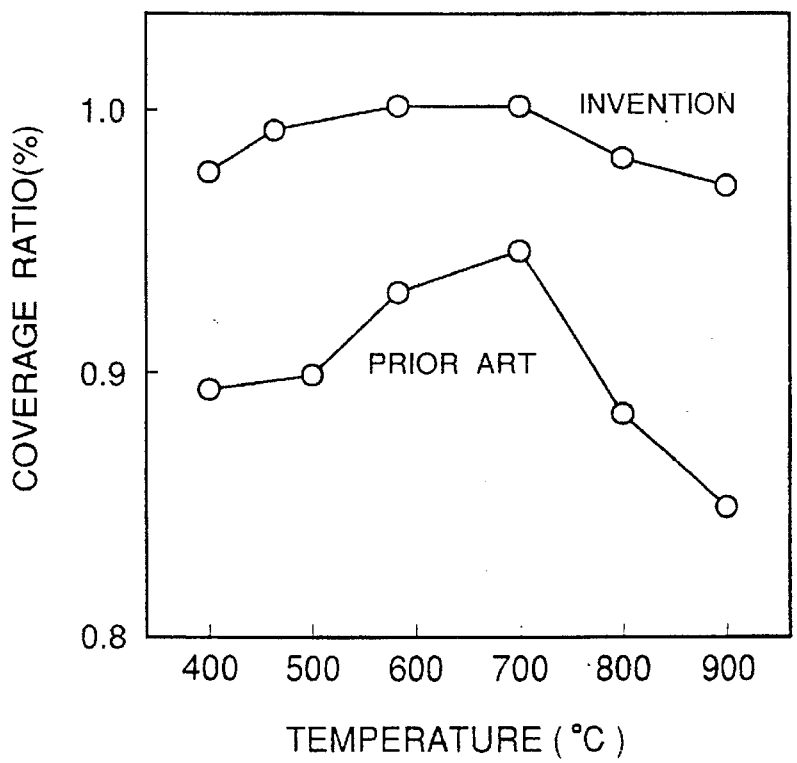
FIG. 7 is a graph showing step coverages of silicon nitride films formed by the process in accordance with the present invention and by a conventional process.

It is well known that a silicon nitride film formed by using monosilane has a poor step coverage since reactive species of $SiH_2$ has a high surface reactivity. $SiH_2$ also has higher reactivity with a silicon surface portion than nitrogen surface portion. Therefore, by introducing hydrogen chloride to silicon surface portions, the surface reactivity of $SiH_2$ is substantially reduced so as to improve the step coverage. In addition, when a silicon nitride film is formed on an uneven surface of a silicon substrate or a poly-silicon layer, surface reactions on an upper surface can be selectively reduced by changing angles of the nozzles. By this, deposition rate of the upper surface approximates that of a side surface so as to improve the step coverage. FIG. 7 is a graph showing step coverages of silicon nitride films formed by using monosilane and ammonia in accordance with the present invention and a conventional process.

As mentioned above, according to the present invention, hydrogen chloride is independently and directly introduced to a surface of the substrate, which makes absorption of the hydrogen chloride to be controlled more easily than that introduced with a starting material gas. In addition, it is possible to increase a ratio of the silane gas to the starting material gas so that a lower process temperature of deposition of the silicon nitride film by LPCVD can be expected. The hydrogen chloride induced to the surface of the substrate and the low process temperature prevent the hydrogen chloride from reacting with ammonia so as to form ammonium chloride so that formation of particles is suppressed.

Figure 5A:
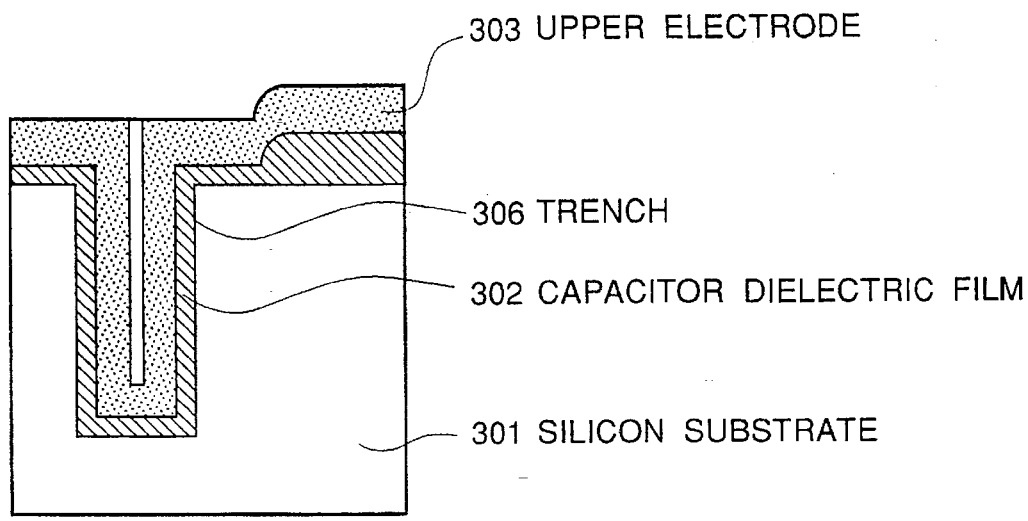
FIGS. 5A to 5C are schematic sectional views of structures of capacitors of DRAMs.
Figure 5B:
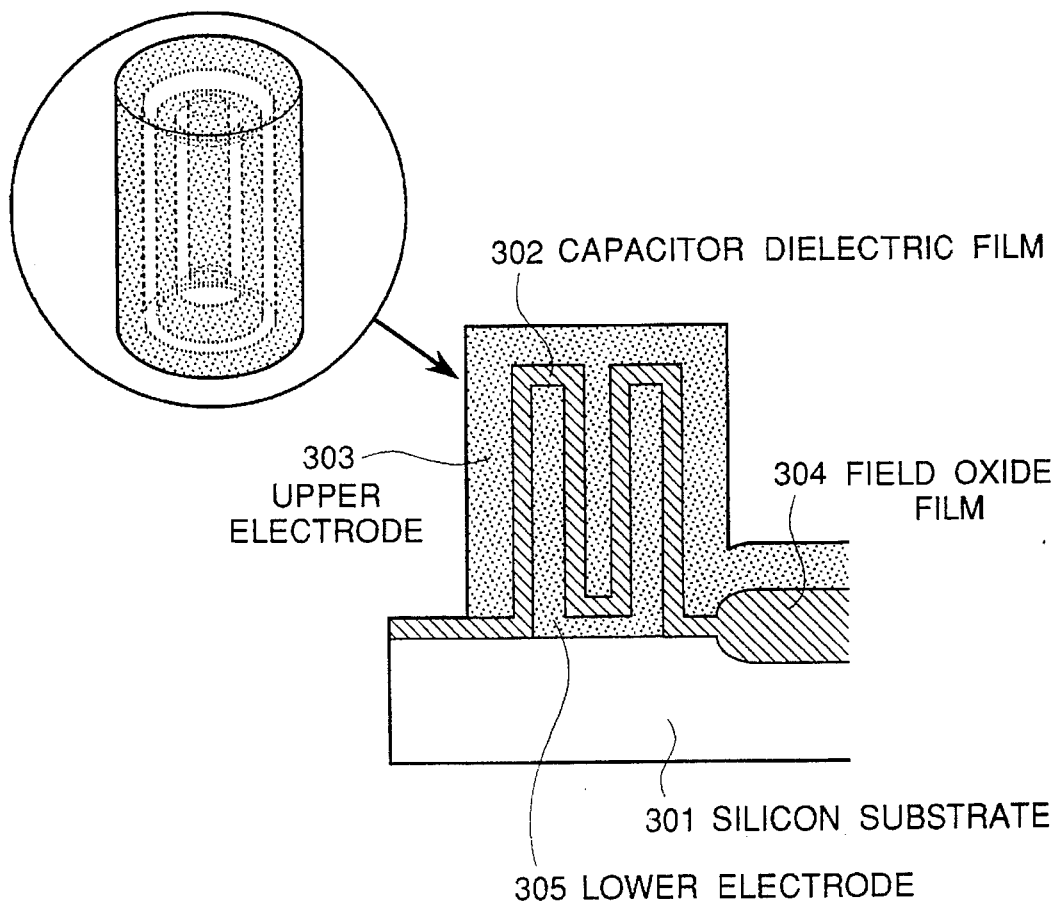
Figure 5C:
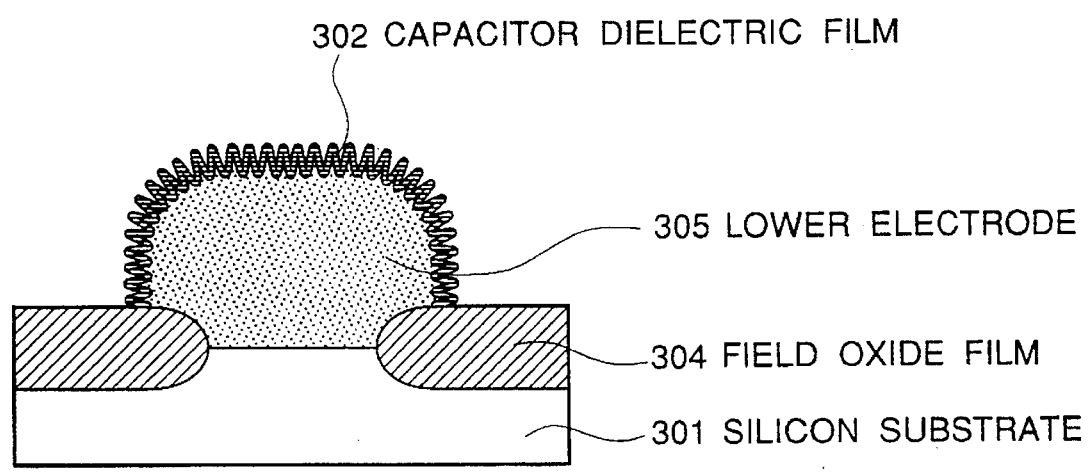

Referring FIGS. 5A to 5C, the positions and angles of the nozzles introducing hydrogen chloride will be explained. FIGS. 5A to 5C are schematic sectional views of capacitors of DRAMs.

The capacitor shown in FIG. 5A has a trench structure comprising a silicon substrate 301 provided with a trench 306, a capacitor dielectric film 302 of silicon nitride film which covers a surface of the silicon substrate 301 and an inner wall of the trench 306 and an upper electrode 303 of poly-silicon formed on the capacitor dielectric film 302.

When the capacitor dielectric film 302 of the capacitor shown in FIG. 5A is formed in accordance with the present invention, the angle θ of the nozzle 209 are determined by an aspect ratio of the trench 306 (a ratio of depth/width of the trench 306). If the aspect ratio is equal to or smaller than 1, the angles θ should be almost equal to 0°. As the aspect ratio becomes larger than 1, the angles θ are gradually increased.

A process similar to the above is applicable for fabrication of the capacitor shown in FIG. 5B. The capacitor shown in FIG. 5B has a cylindrical structure comprising a silicon substrate 301 provided with a field oxide film 304, a lower electrode 305 of poly-silicon having a cylindrical shape, a capacitor dielectric film 302 of silicon nitride film which covers a surface of the silicon substrate 301 and the lower electrode 305 and an upper electrode 303 of poly-silicon which completely covers the capacitor dielectric film 302.

In order to obtain a large capacity in a limited volume, a large surface area is required, so that the capacitor becomes to have a complicated shape, as shown in FIG. 5B comprising a silicon substrate 301 provided with field oxide films 304, a lower electrode 305 of a semi-spherical poly-silicon grain, a capacitor dielectric film 302 of silicon nitride film formed on a surface of the lower electrode 305 provided with micro trenches and micro cavities.

When the capacitor dielectric film 302 of the capacitor shown in FIG. 5C is formed in accordance with the present invention, the nozzle 209 should be parted from the growing surface of the silicon nitride film, as far as possible and the angle θ of the nozzle 209 should be 0°.

The invention has thus been shown and described with reference to the specific embodiments. However, it should be noted that the present invention is in no way limited to the details of the illustrated structures but converts and modifications may be made within the scope of the appended claims.

I claim:

1. A method for forming a silicon nitride film to a predetermined thickness on a silicon substrate and a poly-silicon layer, comprising the steps of:

forming a first silicon nitride film having a thickness less than the predetermined thickness by a rapid thermal nitridation process; and forming a second silicon nitride film on the first silicon nitride film by LPCVD using starting material gases including ammonia ($NH_3$) and one of monosilane ($SiH_4$) and dichlorosilane ($SiH_2Cl_2$), where hydrogen chloride gas is introduced to a growing surface of the second silicon nitride film by a means different from a means supplying starting material gases, the second silicon nitride film being of a thickness such that a total thickness of the first and second silicon nitride films is equal to the predetermined thickness.

* * * * *